US008860955B2

(12) United States Patent
Rodnick et al.

(10) Patent No.: US 8,860,955 B2
(45) Date of Patent: Oct. 14, 2014

(54) ARRANGEMENTS AND METHODS FOR DETERMINING POSITIONS AND OFFSETS

(75) Inventors: Matt Rodnick, San Jose, CA (US); Christine Allen-Blanchette, Oakland, CA (US)

(73) Assignee: Lam Research Corporation, Fremont, CA (US)

( * ) Notice: Subject to any disclaimer, the term of this patent is extended or adjusted under 35 U.S.C. 154(b) by 415 days.

(21) Appl. No.: 12/810,790

(22) PCT Filed: Dec. 19, 2008

(86) PCT No.: PCT/US2008/087578
§ 371 (c)(1),
(2), (4) Date: Jun. 25, 2010

(87) PCT Pub. No.: WO2009/086042
PCT Pub. Date: Jul. 9, 2009

(65) Prior Publication Data
US 2010/0277749 A1 Nov. 4, 2010

Related U.S. Application Data

(60) Provisional application No. 61/017,148, filed on Dec. 27, 2007.

(51) Int. Cl.
*G01B 11/14* (2006.01)
*H01L 21/67* (2006.01)
*G01B 11/27* (2006.01)

(52) U.S. Cl.
CPC ........ *H01L 21/67069* (2013.01); *G01B 11/272* (2013.01); *G01B 11/14* (2013.01); *H01L 21/67265* (2013.01)
USPC ....................................................... 356/623

(58) Field of Classification Search
CPC . H01L 21/67265; G01B 11/14; G01B 11/272
USPC .................. 356/614–624; 250/559.29, 559.3, 250/559.31
See application file for complete search history.

(56) References Cited

U.S. PATENT DOCUMENTS 4,055,376 A * 10/1977 Daberko ........................ 356/616
4,819,167 A * 4/1989 Cheng et al. ................... 700/59
(Continued)

FOREIGN PATENT DOCUMENTS

CA 2305919 10/2000
EP 0462596 6/1991
(Continued)

OTHER PUBLICATIONS

"Hungarian Examination Report", Singapore Patent Application Number: 201004262-0, Mailing Date: Dec. 16, 2011.
(Continued)

*Primary Examiner* — Michael A Lyons
*Assistant Examiner* — Rufus Phillips

(57) ABSTRACT

A method for determining positions and offsets in a plasma processing system, the plasma processing system including at least a chuck and an upper electrode is provided. The method including moving a traversing assembly along a first plurality of paths to generate a first plurality of data sets, the traversing assembly including at least a light source, the light source providing a light beam, moving the traversing assembly along each path of the first plurality of paths causing the light beam to traverse the chuck and resulting in one or more data sets of the first plurality of data sets. The method also including receiving the first plurality of data sets and analyzing the first plurality of data sets to identify a first set of at least three discontinuities, wherein the first set of at least three discontinuities are related to three or more reflected light signals generated when the light beam encounters an edge of the chuck. The method also including determining a center of the chuck using coordinate data associated with the first set of at least three discontinuities.

14 Claims, 5 Drawing Sheets

(56) References Cited

U.S. PATENT DOCUMENTS

| | | | |
|---|---|---|---|
| 4,971,443 A * | 11/1990 | Koyagi | 356/623 |
| 5,530,548 A * | 6/1996 | Campbell et al. | 356/623 |
| 5,546,179 A * | 8/1996 | Cheng | 356/73 |
| 5,675,407 A * | 10/1997 | Geng | 356/147 |
| 5,822,213 A * | 10/1998 | Huynh | 700/213 |
| 5,999,268 A * | 12/1999 | Yonezawa et al. | 356/399 |
| 6,094,264 A * | 7/2000 | Wuyts | 356/237.1 |
| 6,114,705 A | 9/2000 | Leavitt et al. | |
| 6,126,382 A * | 10/2000 | Scales et al. | 414/754 |
| 6,188,323 B1 | 2/2001 | Rosenquist et al. | |
| 6,191,851 B1 * | 2/2001 | Kirkham et al. | 356/243.4 |
| 6,195,619 B1 | 2/2001 | Ren | |
| 6,339,730 B1 * | 1/2002 | Matsushima | 700/218 |
| 6,502,054 B1 | 12/2002 | Mooring et al. | |
| 6,629,053 B1 | 9/2003 | Mooring | |
| 6,747,746 B2 * | 6/2004 | Chizhov et al. | 356/614 |
| 6,895,831 B2 * | 5/2005 | Hunter | 73/865.9 |
| 6,917,698 B2 * | 7/2005 | Obi | 382/151 |
| 6,952,255 B2 * | 10/2005 | Perry et al. | 356/141.2 |
| 7,158,280 B2 * | 1/2007 | Sandstrom | 359/290 |
| 7,197,828 B2 * | 4/2007 | Lof et al. | 33/1 M |
| 7,352,440 B2 * | 4/2008 | Hoogendam et al. | 355/55 |
| 8,099,192 B2 | 1/2012 | Genetti et al. | |
| 2002/0068992 A1 | 6/2002 | Hine et al. | |
| 2003/0231950 A1 | 12/2003 | Raaijmakers | |
| 2004/0167743 A1 | 8/2004 | Hosek | |
| 2004/0258514 A1 | 12/2004 | Raaijmakers | |
| 2005/0102064 A1 | 5/2005 | Donoso et al. | |
| 2005/0137751 A1 | 6/2005 | Cox et al. | |
| 2005/0276920 A1 | 12/2005 | Kim | |
| 2006/0009047 A1 | 1/2006 | Wirth et al. | |
| 2006/0045666 A1 | 3/2006 | Harris et al. | |
| 2007/0112465 A1 | 5/2007 | Sadighi et al. | |
| 2007/0177963 A1 | 8/2007 | Tang et al. | |
| 2008/0061255 A1 | 3/2008 | Park | |

FOREIGN PATENT DOCUMENTS

| | | |
|---|---|---|
| EP | 1 175 970 A2 | 1/2002 |
| EP | 1669808 | 6/2006 |
| JP | 2000-114347 A | 4/2000 |
| JP | 2002-313872 A | 10/2002 |
| JP | 2004-050306 A | 2/2004 |
| JP | 2004-080001 A | 3/2004 |
| JP | 2004-288792 A | 10/2004 |
| KR | 2005-0010849 A | 1/2005 |
| WO | WO-97-37376 A1 | 10/1997 |
| WO | WO-99-02996 A2 | 1/1999 |
| WO | WO-01/78114 | 10/2001 |
| WO | WO-2003/087436 | 10/2003 |
| WO | WO-2004-086465 A2 | 10/2004 |
| WO | WO-2005-037495 A1 | 4/2005 |

OTHER PUBLICATIONS

"International Preliminary Report on Patentability", Issued in PCT Application No. PCT/US2008/087556; Mailing Date: Jul. 8, 2010.

"International Search Report", issued in PCT Application No. PCT/US2008/087556: Mailing Date: Aug. 7, 2009.

"Written Opinion", Issued in PCT Application No. PCT/US2008/087556; Mailing Date: Aug. 7, 2009.

"International Search Report", Issued in PCT Application No. PCT/US2008/087684; Mailing Date: Jul. 29, 2009.

"Written Opinion", Issued in PCT Application No. PCT/US2008/087684; Mailing Date: Jul. 29, 2009.

"International Preliminary Report on Patentability", Issued in PCT Application No. PCT/US2008/087684; Mailing Date: Jul. 8, 2010.

"International Search Report", issued in PCT Application No. PCT/US2008/087775; Mailing Date: Aug. 5, 2009.

"Written Opinion", issued in PCT Application No. PCT/US2008/087775; Mailing Date: Aug. 5, 2009.

"International Preliminary Report on Patentability", Issued in PCT Application No. PCT/US2008/087775; Mailing Date: Jul. 8, 2010.

"International Search Report", Issued in PCT Application No. PCT/US2008/087578; Mailing Date: Aug. 5, 2009.

"Written Opinion", issued in PCT Application No. PCT/US2008/087578; Mailing Date: Aug. 5, 2009.

"International Preliminary Report on Patentability", issued in PCT Application No. PCT/US2008/087578; Mailing Date: Jul. 8, 2010.

"Non Final Office Action", U.S. Appl. No. 12/810,780, Mailing Date: May 24, 2012.

"Hungarian Examination Report", Singapore Patent Application No. 201009526-8, Mailing Date: Dec. 2, 2011.

"Hungarian Search Report", Singapore Patent Application No. 201009526-8, Mailing Date: Dec. 2, 2011.

"Hungarian Examination Report", Singapore Patent Application No. 201004301-6, Mailing Date: Dec. 2, 2011.

"Hungarian Search Report", Singapore Patent Application No. 201004301-6, Mailing Date: Dec. 2, 2011.

"Non Final Office Action", U.S. Appl. No. 12/810,777, Mailing Date: Oct. 1, 2012.

* cited by examiner

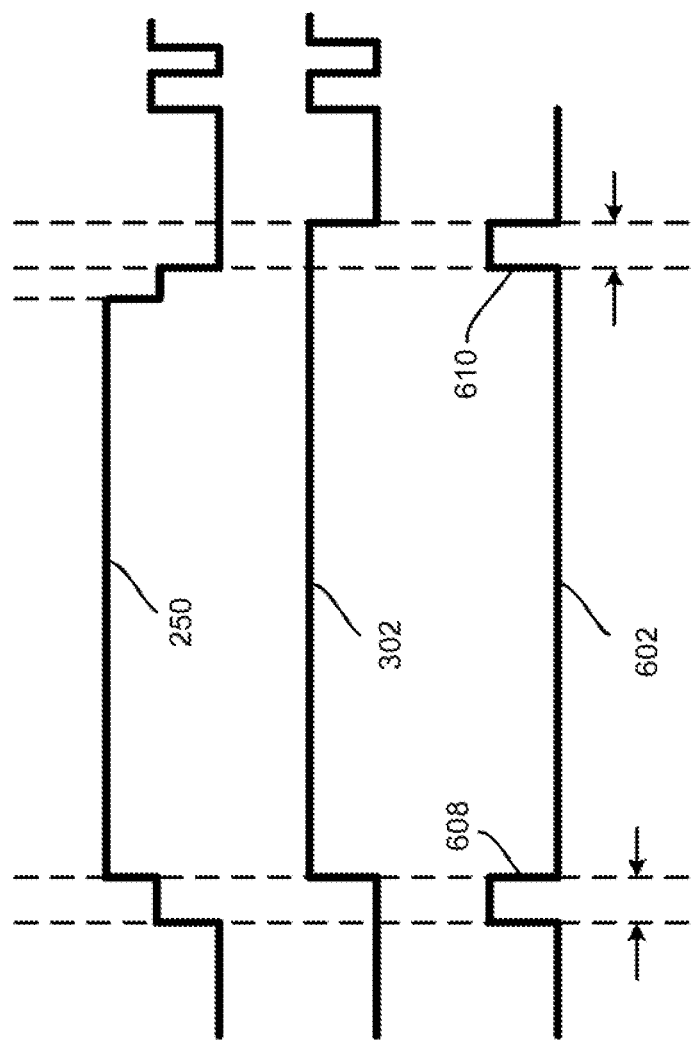

ARRANGEMENTS AND METHODS FOR DETERMINING POSITIONS AND OFFSETS

PRIORITY CLAIM

This application is related to and claims priority under 35 U.S.C. §119(e) to a commonly assigned provisional patent application entitled "In-Situ Optical Techniques for Determining Positions and Offsets," by Allen-Blanchette et al., Application Ser. No. 61/017,148, filed on Dec. 27, 2007, and under 35 U.S.C. 371 to a PCT Application No. PCT/US2008/087578, filed on Dec. 19, 2008, all of which are incorporated herein by reference.

BACKGROUND OF THE INVENTION

In the processing of semiconductor substrates (e.g., wafers), plasma is often employed. In plasma processing, the wafers are processed using a plasma processing system, which typically includes a plurality of processing modules. The substrate (e.g., wafer) is disposed on a chuck inside a processing module during plasma processing.

In order to move a wafer in and out of the processing module, the wafer is typically placed on an end effector and transferred onto the chuck. The end effector is a structural component configured for supporting the wafer during wafer transfer. The end effector is typically disposed on a robot arm. FIG. 1 shows a representative prior art end effector 102 for supporting a wafer 104 during wafer transfer. For illustration purposes, a portion of a robot arm 106 is also shown.

Generally speaking, during a wafer transfer sequence, the robot arm first moves the end effector to pick up the wafer from a wafer storage cassette or station. Once the wafer is positioned on the end effector, the robot arm would then move the wafer into the plasma processing module through a door in the processing module. The robot arm then positions the end effector and the wafer over the chuck and then places the wafer on the chuck for plasma processing.

In order to ensure that the wafer is processed properly (thereby ensuring controllable and repeatable process results), the wafer needs to be centered on the chuck during plasma processing. If the end effector is correctly centered relative to the chuck and the wafer is correctly centered relative to the end effector, then the wafer would be correctly centered relative the chuck when the robot arm places the wafer on the chuck. However, for many reasons, some of which are discussed below, this ideal scenario is rarely the case.

Due to machining and/or manufacturing tolerances between the various components of the processing chamber, it is possible that the center defined by the end effector (herein referred to as the "end effector center" or the "end effector-defined center") is slightly offset relative to the center of the chuck in a given processing module. As a result, it is possible that the end effector-defined center may not be correctly aligned with the center of the chuck at the robot arm position that the robot controller deems to be the correct position for wafer placement. If this end effector/chuck mis-alignment is not compensated for during production, the wafer may be inaccurately placed relative to the chuck center during wafer processing.

To compensate for the end effector/chuck mis-alignment, the typical strategy during calibration involves moving the robot arm to a position where the end effector-defined center actually aligns with the center of the chuck. To accomplish end effector calibration, it is necessary that the operator be able to ascertain the actual end effector/chuck alignment position. In the prior art, the alignment of the end effector-defined center to the chuck center is accomplished using a fabricated mechanical fixture which fits on the edge of the chuck or attaches to the processing module interior. The mechanical fixture has a key feature (essentially a centering protrusion for the end effector), which allows the end effector to rest right up against the key feature of the calibration fixture. Since the fixture is centered relative to the chuck, when the end effector rests against the key feature of the fixture, the end effector would be centered on the chuck. Typically, positioning the end effector against the key feature is accomplished by an operator pulling or pushing the end effector against the key feature so that the end effector rests against the key feature.

After the operator has positioned the end effector against the key feature, the operator then registers the robot arm position with the robot control system so that the robot control system can record, in the robot control's coordinate system, the position of the robot arm that achieves this actual end effector/chuck alignment.

During production, the robot arm moves the end effector to the coordinates associated with this effector/chuck alignment position. If the wafer is centered with respect to the end effector, the fact that the end effector-defined center now actually aligns with the chuck center would cause the wafer to be centered relative to the chuck when the wafer is placed by the robot arm on the chuck for wafer processing.

However, there are disadvantages with the prior art technique for centering the end effector relative to the chuck for calibration purposes. First of all, there are many types of chucks and processing modules in existence. Therefore, in order to use the mechanical fixture approach to perform calibration, many different mechanical fixtures must be fabricated and stocked. Also, affixing a physical mechanical fixture, which may have one or more hard metal edges or surfaces, on the chuck may potentially damage the chuck. Additionally, if this calibration is done in the field after some plasma cycles have been executed in the processing module (e.g., in response to a concern that the end effector may not be centered relative to the chuck following a production run), the attachment of a physical calibration fixture on the chuck may cause deposited particles on or near the chuck to flake off into the processing chamber. During the subsequent processing cycles, such particles constitute particle contamination, which is undesirable.

Additionally, because the calibration is performed at atmospheric pressure, the prior art calibration technique may not effectively duplicate the conditions that exist during production. This is because during production, components of the processing module may be placed under vacuum, causing one or more components to shift due to the pressure differential between the vacuum environment and the ambient atmosphere. Since the calibration conditions do not faithfully duplicate the production conditions, accurate calibration may not be possible.

Furthermore, if the positioning of the end effector at the end effector/chuck alignment position is performed manually (e.g., involving the operator pulling or pushing the end effector to rest up against the key feature of the mechanical fixture), there may be a shift in the robot arm position when the operator releases the robot arm to go and register this end effector/chuck alignment position with the robot controller. This shift may occur for many reasons, including for example the fact that the robot motors are de-energized. When the robot arm pulls away, even by a small amount that may be imperceptible to the robot operator, this shift may result in inaccuracy in the calibration process. If the calibration process is inaccurate, inaccurate wafer placement during production may occur, leading to decreased yield and an increase in the rejection and/or failure rate for the fabricated products.

The aforementioned discussion pertains to the possible misalignment between the end effector and the chuck, and the prior art solution therefor. However, even if the end effector-defined center is correctly aligned with the chuck center (or can be made to achieve the effect of a correct alignment), there exists another potential source of error that may result in wafer/chuck mis-alignment during production. That is, different production wafers may be positioned on the end effector differently. If the end effector-defined center is not correctly or consistently aligned with the center of the wafers, wafer/chuck mis-alignment may still occur during production. In this case, even though the end effector center is correctly aligned with the chuck center, the wafer/end effector mis-alignment will cause the wafer to be offset relative to the chuck when the end effector deposits the wafer on the chuck for processing.

The same manufacturing and assembly tolerance issues also affect the alignment of the upper electrode relative to the lower electrode. For example, in some production plasma processing systems, manufacturing and assembly tolerances may cause the upper electrode to be slightly offset from the chuck, resulting in an asymmetrical plasma sheath, which affects the controllability of the plasma processing. As another example, the upper electrode may be configured to be movable in some plasma processing systems. Over time, the upper electrode assembly may develop "play" or out-of-spec tolerances, resulting in a detrimental upper electrode/chuck offset. As a result, plasma processing result may suffer.

As can be seen from the foregoing, various misalignment issues may exist and/or develop over time between components in a plasma processing module. As discussed, if these misalignment issues are addressed using external tools or external alignment fixtures, potential damage to the processing module components may result. Further, if the misalignment issues are addressed outside of the processing module environment, errors may arise due to the dissimilarities in chamber conditions (e.g., the dissimilarities in chamber conditions that exist during alignment and chamber conditions that exist during production).

Still further, if the prior art requires shuffling wafers in and out of the processing module in order to address misalignment issues, an undue amount of time may be wasted on alignment issues alone. The wasted time contributes to a higher cost of ownership for operators of plasma processing tools, which tends to translate into lower production of finished devices per unit of time and/or higher per-unit device cost.

SUMMARY OF INVENTION

The invention relates, in an embodiment, a method for determining positions and offsets in a plasma processing system, the plasma processing system including at least a chuck and an upper electrode is provided. The method including moving a traversing assembly along a first plurality of paths to generate a first plurality of data sets, the traversing assembly including at least a light source, the light source providing a light beam, moving the traversing assembly along each path of the first plurality of paths causing the light beam to traverse the chuck and resulting in one or more data sets of the first plurality of data sets. The method also including receiving the first plurality of data sets and analyzing the first plurality of data sets to identify a first set of at least three discontinuities, wherein the first set of at least three discontinuities are related to three or more reflected light signals generated when the light beam encounters an edge of the chuck. The method also including determining a center of the chuck using coordinate data associated with the first set of at least three discontinuities.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIG. 6 illustrates, in accordance with an embodiment of the invention, the determination of offsets from two traces.

DETAILED DESCRIPTION OF EMBODIMENTS

Figure 1:
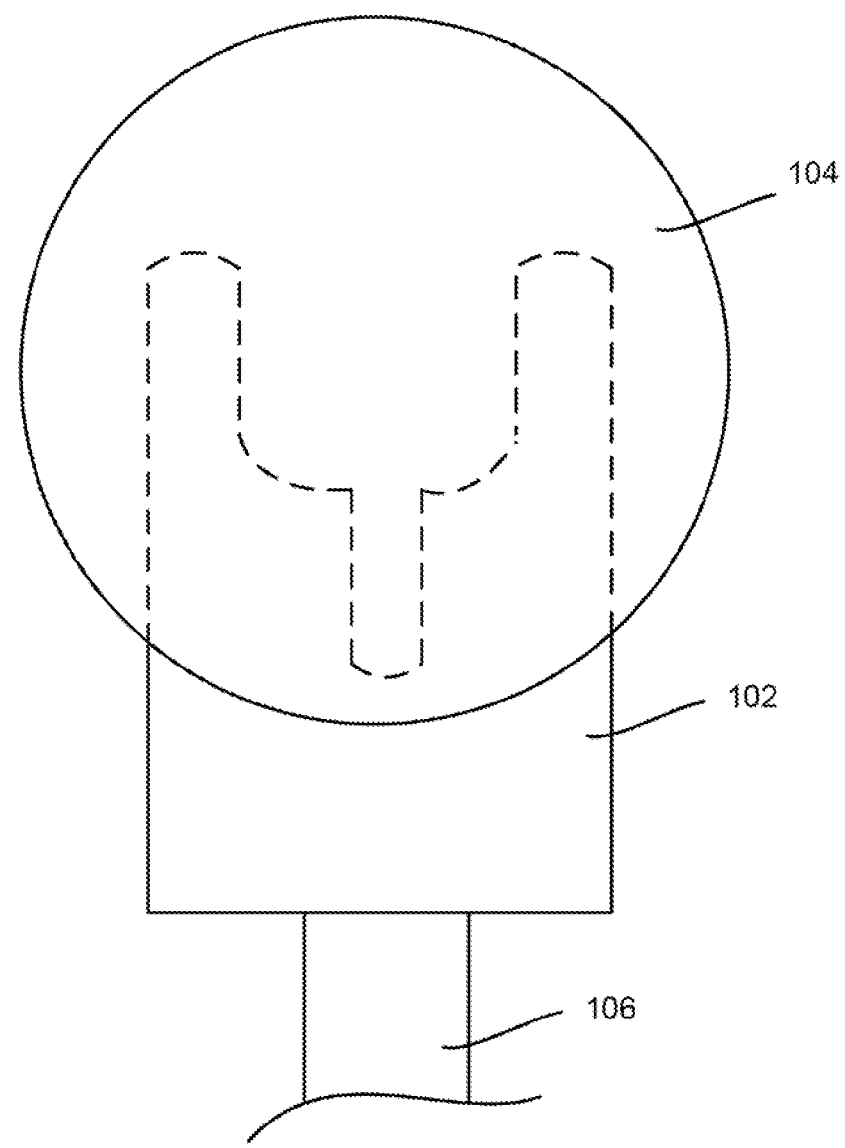
FIG. 1 shows a representative prior art end effector for supporting a wafer during wafer transfer.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described herein below, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

Embodiments of the invention relate to in-situ optical techniques for ascertaining the position of components and objects in a processing module and/or the offset (e.g., misalignment) between components and/or objects in a plasma processing module. By ascertaining the existence and/or the extent of misalignment among processing module components, the end effector and/or the wafer, strategies may be developed (such as robot arm positioning compensation or repositioning/reassembly of components) to address the misalignment.

Unlike prior art approaches, embodiments of the invention are capable of measuring the offset between various processing module components (such as between the chuck and the upper electrode) in-situ and in a manner that does not pose a damage risk to components of the processing module. Furthermore, embodiments of the invention are capable of measuring the offset between the wafer, either right before wafer drop or after wafer drop onto the chuck, and various processing module components in-situ and also in a manner that does not potentially damage the wafer or the components. Additionally, embodiments of the invention are capable of assessing wafer processing accuracy (such as process concentricity of the bevel etch relative to the wafer center) in-situ and in a manner that also does not potentially damage the wafer or the components. Still further, embodiments of the invention are capable of self-calibrating using in-situ optical techniques to obviate issues associated with atmospheric-condition calibration using a hardware fixture.

In one or more embodiments of the invention, the in-situ optical technique involves optically measuring reflectivity discontinuities as a light beam traverses the interior of a plasma processing module. As the light beam traverses the components inside the plasma processing module, reflectivity measurements are taken. When a light beam encounters a transition between one reflectivity region and another reflectivity region, the measured reflectivity changes. For example, a light beam that is kept perpendicular to the plane that is formed by the upper surface of the chuck may traverse in a straight line toward the chuck, across the chuck's upper surface, and away from the chuck. When the light beam first encounters the chuck periphery, there is a transition from one reflectivity region to another reflectivity region, and the measured reflectivity of the light beam changes correspondingly.

In this case, the change in reflectivities may be recorded and analyzed to recognize a discontinuity. After the light beam completes its traversal across the chuck's upper surface and starts to move away from the chuck, another change in reflectivity regions is experienced as the beam transitions from the chuck's edge to the surrounding area(s). In this case, the change in reflectivities may be recorded and analyzed to recognize another discontinuity. By making multiple passes across the chuck's upper surface and recording the beam positions where discontinuities occur, it is possible to ascertain the position of the chuck, including the position of the chuck's center, in the beam's coordinate system. The determination of a circle from 3 or more points on its circumference is a known mathematical exercise and will not be repeated here.

In another embodiment, the light beam may also traverse the upper electrode's plasma-facing surface. Again, discontinuities in reflectivities may be obtained as the light beam transitions from outside of the upper electrode to the upper electrode surface itself and then away from the upper electrode again. By making multiple passes across the upper electrode surface and recording where discontinuities occur, it is possible to ascertain the position of the upper electrode, including the position of the upper electrode's center, in the beam's coordinate system.

In one or more embodiments, the positions of the upper electrode and the chuck, which positions are acquired by analyzing the data regarding the discontinuities, may be employed to calculate the relative offset between the upper electrode and the chuck. Since the positions of the upper electrode and the chuck are both ascertained in the beam's coordinate system, it is possible to compare their positions and obtain the relative offset. The relative offset value may yield valuable information that may help a field engineer address any undesirable upper electrode/chuck offset and to more efficiently trouble-shoot process problems.

In one or more embodiments, if the laser assembly is accurately calibrated, the absolute position of the chuck (as ascertained from the reflectivity discontinuity recordings) may be compared against the expected position of the chuck, and any offset from the expected position may be ascertained. Similarly, if the laser assembly is accurately calibrated, the absolute position of the upper electrode (as ascertained from the reflectivity discontinuity recordings) may be compared against the expected position of the upper electrode, and any offset from the expected position may be ascertained. Again, these offsets may help a field engineer ascertain whether there exists an alignment problem with the chuck and/or the upper electrode.

In one or more embodiments of the invention, an in-situ optical calibration technique is provided. In an embodiment, an optical calibration fixture having calibration regions of known reflectivities is positioned in a pre-defined location along the light beam's path (e.g., on one side of the chuck and/or on one side of the upper electrode). For example, a calibration plate having a first calibration region of M % reflectivity positioned adjacent to a second calibration region of N % reflectivity may be provided (where M % and N % represent known reflectivities).

As the beam traverses this optical calibration fixture, the measured reflectivity changes depending on the calibration region encountered. By comparing the reflectivity recordings against the known reflectivities of the calibration regions, the accuracy of the reflectivity recording sensors and/or the analyzing logic may be calibrated. Further, the logic portion that is responsible for detecting discontinuities may also be calibrated. Additionally or alternatively, since the optical calibration fixture may be positioned at a known, predefined location, the recorded position of reflectivity discontinuity may be compared against the expected position of reflectivity discontinuity. With this data, the accuracy of the system(s) involved in moving the beam and/or recording the beam's position may also be calibrated.

In one or more embodiments of the invention, the in-situ optical technique may be employed to measure the absolute position of the wafer or the offset between the wafer and other components of the processing module (such as the chuck, the upper electrode, or even the robot arm/effector). In an embodiment, a light beam that is kept perpendicular to the plane that is formed by the upper surface of the wafer may traverse in a straight line toward the wafer, across the wafer's upper surface, and away from the wafer. When the light beam first encounters the wafer periphery, there is a transition from one reflectivity region to another reflectivity region, and the reflectivity of the light beam changes correspondingly.

In this case, the change in reflectivities may be recorded and analyzed to recognize a discontinuity. After the light beam moves across the wafer's upper surface and starts to move away from the wafer, another change in reflectivity regions is experienced as the beam transitions from the wafer's edge to the surrounding area(s). In this case, the change in reflectivities may be recorded and analyzed to recognize another discontinuity. By making multiple passes across the wafer's upper surface and recording the beam position where discontinuities occur, it is possible to ascertain the position of the wafer, including the position of the wafer's center, in the beam's coordinate system.

Further, if the wafer is positioned above the chuck, either on the end effector prior to wafer drop or if the wafer sits on the chuck itself, the edge of the wafer and the edge of the chuck result in light beam reflectivity discontinuities. By recording the beam position where these discontinuities occur, it is possible to determine after one or more passes whether the wafer is positioned concentrically relative to the chuck. If the position of the upper electrode is also ascertained using a light beam traversing the upper electrode in the manner discussed earlier, it is also possible to determine whether an offset exists between the wafer and the upper electrode and the extent of such offset.

If the beam path traverses the robot arm and/or the end effector, it is possible to extrapolate or curve fit to find the center of the end effector or the position of the robot arm from the reflectivity discontinuities data. This information may also be employed to align the robot arm and/or the end effector for optimal wafer transport.

In one or more embodiments of the invention, the optical in-situ technique may also be employed to assess the efficacy of the bevel etch process. To elaborate, a wafer generally has at least two regions: a wafer forming region that occupies most of the center region of the wafer and a "ring" or "bevel" region that exists at the outer periphery of the wafer where, generally speaking, no devices are formed. Note that while it is highly desirable to maximize the wafer forming region in any given wafer to maximize device yield, a ring or bevel region nevertheless exists and is typically not employed to form devices due to various process uniformity and other reasons.

Even though the bevel region is not employed for device formation, certain process steps may result in the unintended and incidental processing (e.g., deposition) in the bevel region. If left unremoved, this unintended deposition in the bevel region may degrade the processing result in a subsequent etch step, for example. Accordingly, a bevel etch is often employed to remove or "clean" materials from the bevel region before one or more subsequent processing steps.

Since the bevel region tends to be immediately adjacent to and surrounding the device-forming region, the accuracy of the bevel etch designed to remove materials only from the bevel region (but not from the device-forming region) is critical. If the etch is inaccurate, it is possible to unintentionally remove materials from the device forming region, leading to defects in the end products.

In one or more embodiments, the accuracy of the bevel etch is ascertained using an in-situ optical technique. In an embodiment, a light beam that is kept perpendicular to the plane that is formed by the upper surface of the wafer may traverse in a straight line toward the wafer, across the wafer's upper surface, and away from the wafer. When the light beam first encounters the wafer periphery, there is a transition from one reflectivity region to another reflectivity region, and the reflectivity of the light beam changes correspondingly.

In this case, the change in reflectivities may be recorded and analyzed to recognize a discontinuity. After the light beam moves across the wafer's bevel region, the light beam encounters the start of the device-forming region. At this point, there is a transition from one reflectivity region to yet another reflectivity region, and the reflectivity of the light beam changes again correspondingly. The change in reflectivities may be recorded and analyzed to recognize another discontinuity.

As the beam continues to traverse the wafer's surface over the device-forming region, the beam approaches the other side of the wafer. First the beam will transition from the device-forming region back to the bevel region. Another reflectivity discontinuity is encountered and the beam position therefor may be recorded. Finally, after the light beam traverses across the bevel region, the light beam encounters the wafer edge and another reflectivity discontinuity is encountered.

By making multiple passes across the wafer, it is possible to extrapolate the device forming region and the bevel region and to ascertain whether the bevel region is concentric relative to the wafer. If there is an offset between the center of the wafer and the center of the concentric "ring" that is the bevel region, this offset may suggest a problem with the bevel etch accuracy, and the in-situ data may be employed as a feedback to address the etch accuracy issue.

Figure 2:
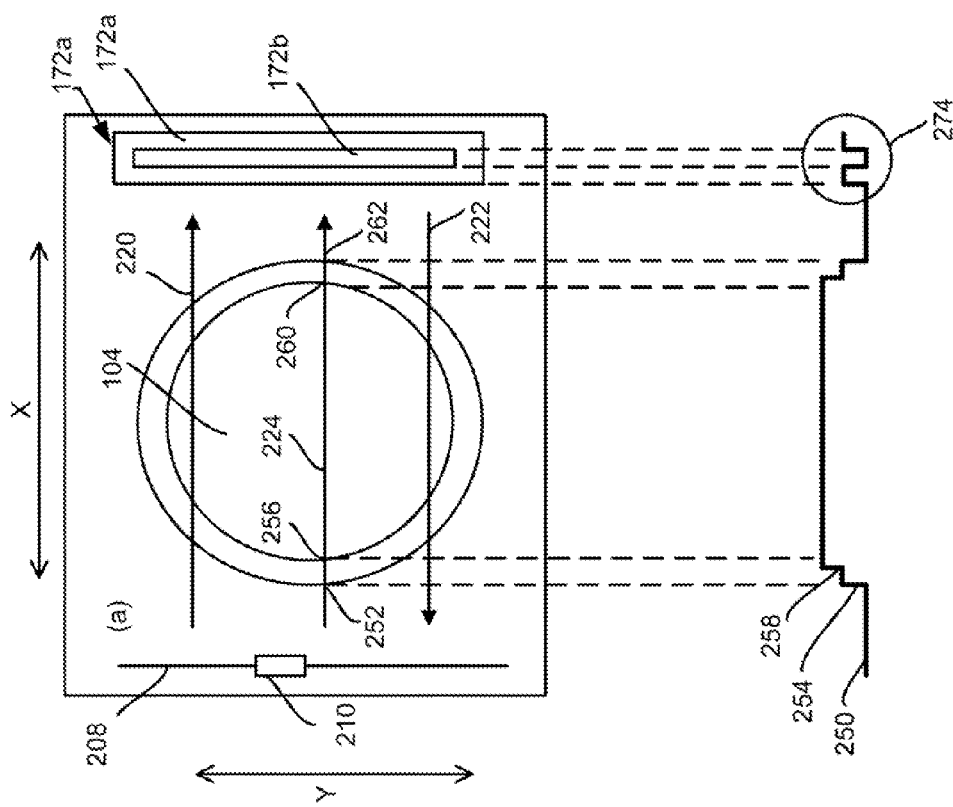
FIG. 2 shows, in accordance with an embodiment of the invention, a top-down view of an in-situ optical measurement apparatus in a processing module having a chuck.

The features and advantages of the invention may be better understood with reference to the figures and discussions that follow. FIG. 2 shows, in accordance with an embodiment of the invention, a top-down view of an in-situ optical measurement apparatus in a processing module 202 having a chuck 204. The in-situ optical measurement apparatus includes a laser-traversing assembly that comprises, in this example, a traverser bar 208 and a laser assembly 210. Traverser bar 208 is configured to move in a constant velocity (which may vary for different applications) in the direction X above the surface of the chuck as shown. Laser assembly 210 is configured to ride along direction Y on traverser bar 208 and represents an integrated laser and sensor assembly configured to emit a light beam in the direction perpendicular to plane that is formed by the top surface of chuck 204. The integrated sensor records the reflectivity data from the light beam as laser assembly 210 traverses along paths 220, 222 and 224 in the example of FIG. 2.

FIG. 2 also shows a trace 250, representing the reflectivity measurements obtained by the sensor of laser assembly 210 as laser assembly 210 traverses along path 224. Path 224 is selected to simplify the explanation of the operation of the in-situ optical measurement system and may not necessarily represent the path employed during actual measurement. For example, paths 220 and 222 may be deemed, in some cases, more suitable for obtaining the desired measurement data.

In the example of FIG. 2, the chuck is multi-layered and the reflectivity measurements are shown in trace 250 as the light beam traverses along path 224. For example, when the light beam encounters location 252 on the edge of chuck 204, a discontinuity 254 is seen in trace 250. When the light beam encounters location 256 of on the edge chuck 204, another discontinuity 258 is seen in trace 250. The current position of the laser emitter (which position is obtained from, for example, the stepper motor encoder values for the motors that move traverser bar 208 and laser assembly 210) is recorded at each instance a reflectivity discontinuity is detected.

Similar discontinuities are seen in trace 250 as the light beam reaches the opposite side of the chuck as laser assembly 210 traverses along path 224. Again, the current positions of the laser emitter are recorded for these discontinuities. Since these reflectivity discontinuity positions are recorded in the laser-traversing assembly coordinate system, it is possible to calculate, using the coordinates for these positions, the position where path 224 crosses locations 252 and 256, as well locations 260 and 262. If multiple paths (e.g., one or more of paths 220 or 222) are traversed, sufficient discontinuity-correlated position data points may be obtained to permit the calculation, in the laser-traversing assembly coordinate system, of the circle that represents the chuck, as well as the chuck center.

In FIG. 2, an optical calibration fixture 270 is also shown. Optical calibration assembly includes at least two calibration regions 272a and 272b having known reflectivities. When the light beam hits these calibration regions, the recorded reflectivity data (shown by reference number 274 on trace 250) may be employed to calibrate the sensor that senses the reflectivity. Alternatively or additionally, calibration fixture 270 may be positioned at a known location in the processing module. The coordinates of the laser emitter when the reflectivity discontinuities are encountered may be obtained. These coordinates may be compared against the known position of the optical calibration fixture 270 in order to calibrate the motor controller(s) and/or the positioning sensing logic of the laser-traversing assembly.

Figure 3:
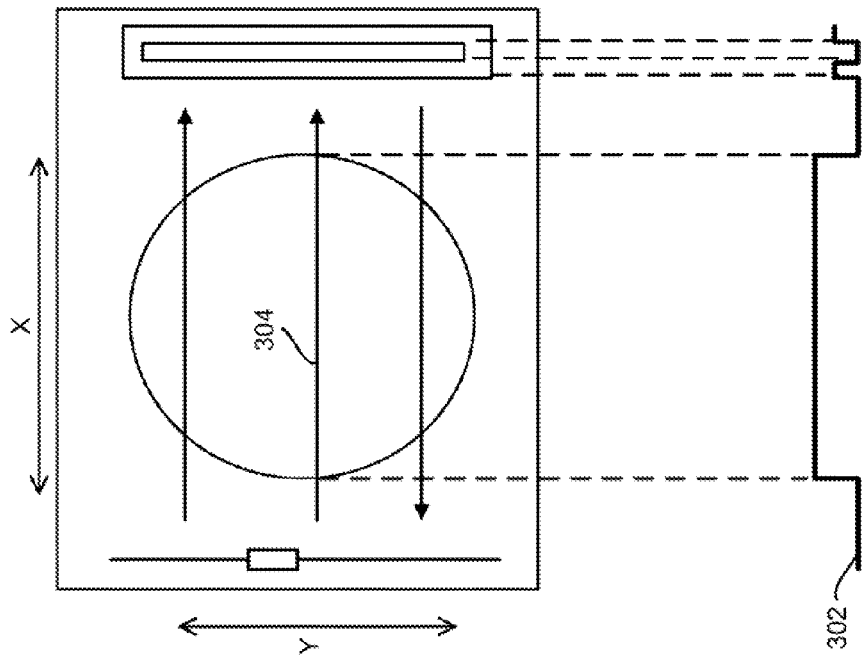
FIG. 3 shows, in accordance with an embodiment of the invention, an analogous situation to FIG. 2 except that the view is a bottom-up view of the upper electrode.

FIG. 3 shows, in accordance with an embodiment of the invention, an analogous situation except that the view is a bottom-up view of the upper electrode. Again, the laser-traversing assembly permits the traverser bar to move in direction X while the laser assembly that includes both the laser emitter and the reflectivity sensor moves in direction Y. The discontinuity data is represented by trace 302 as shown as the laser traversing assembly traverses along path 304.

Figure 4:
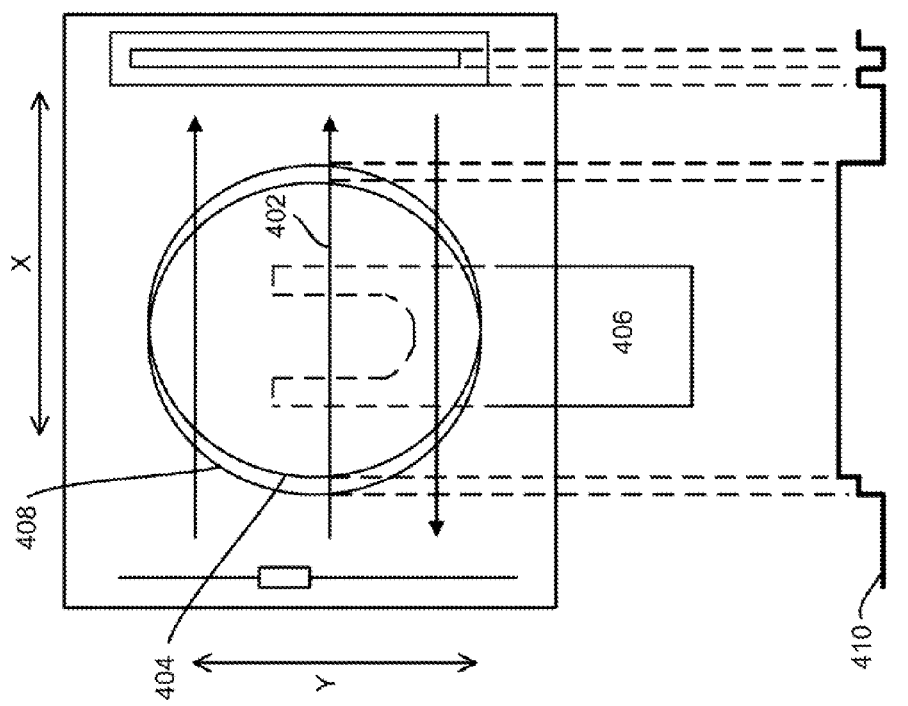
FIG. 4 shows, in accordance with an embodiment of the invention, an arrangement for obtaining the reflectivity discontinuity data as the laser assembly traverses along paths across a wafer.

FIG. 4 shows, in accordance with an embodiment of the invention, an arrangement whereby the reflectivity discontinuity data is obtained as the laser assembly traverse along path 302 across a wafer 404, which sits on an end effector 406. Wafer 404 is positioned above a chuck 408 in FIG. 4. The reflectivity discontinuities are represented in trace 410 as shown. By recording the laser emitter positions at the locations where reflectivity discontinuities are encountered, sufficient data may be obtained after a few traversal paths are taken in order to facilitate the extrapolation of the circles that represents the wafer and the chuck. These extrapolated circles may then be examined to determine whether there exists an offset between the wafer and the chuck, and the extent of such offset.

With reference to FIG. 4, if the wafer is not present, it is possible to obtain, if desired, reflectivity discontinuity data to extrapolate the position and/or center of the end effector, either alone or relative to the chuck. Alternatively, the laser traversal paths may be configure to cross some identifiable portion of the robot arm and/or the end effector even if the wafer sits on the end effector. The light beam may be emitted from below or above the end effector. If the shape of the robot arm and the location of the end effector on the robot arm are known, it is possible to extrapolate the end effector center from the reflectivity discontinuity data, either alone or relative to the chuck in order to determine whether any undue offset exists.

Figure 5:
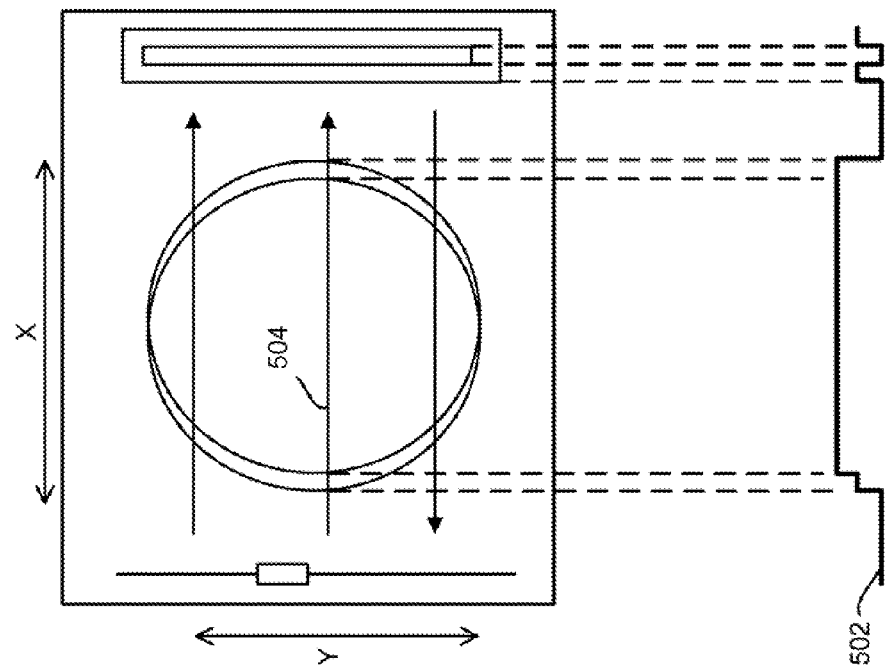
FIG. 5 shows, in accordance with an embodiment of the invention, an analogous arrangement to FIG. 4 except that the wafer has been dropped on the chuck.

FIG. 5 shows, in accordance with an embodiment of the invention, an analogous arrangement except that the wafer has been dropped on the chuck. Again, the laser-traversing assembly permits the traverser bar to move in direction X while the laser assembly that includes both the laser emitter and the reflectivity sensor moves in direction Y. The discontinuity data is represented by trace 502 as shown as the laser traversing assembly traverses along path 504. Also again by recording the laser emitter positions at the locations where reflectivity discontinuities are encountered, sufficient data may be obtained after a few traversal paths are taken in order to facilitate the extrapolation of the circles that represents the wafer and the chuck. These extrapolated circles may then be examined to determine whether there exists an offset between the wafer and the chuck after the wafer is placed on the chuck, and the extent of such offset. The computed offset may be compensated for in subsequent wafer transfers by, for example, moving the robot arm by some distance to account for the computed offset such that when a subsequent wafer is placed on the chuck, the misalignment is eliminated.

Trace comparison may be performed to obtain relative position information, in one or more embodiments. For example, by comparing trace 302 (obtained by scanning the upper electrode in FIG. 3) with trace 250 (obtained by scanning the chuck in FIG. 2), it is possible to ascertain whether an offset exists between the chuck and the upper electrode. In order to perform the comparison, trace 250 and trace 302 represent reflectivity data obtained as the laser assemblies traverse the same path in the processing module. FIG. 6 shows this example wherein the comparison of trace 302 and trace 250 results in trace 602. In the example of FIG. 6, the two traces are subtracted from one another, and pulses 608 and 610 are obtained. If the chuck is offset from the upper electrode, the widths of pulse 608 and 610 would differ, suggesting a degree of non-concentricity between the chuck and the upper electrode.

Similar comparisons may be made between any pair of traces in order to obtain the relative positioning of the processing module components (e.g., chuck, robot arm, end effector, upper electrode, etc.) and/or the wafer and/or the device-forming region on the wafer and/or the bevel region on the wafer. For example, it is possible to determine the relative positions of the following: the wafer relative to the chuck, the chuck relative to the upper electrode, the upper electrode relative to the wafer, the end effector relative to the chuck, the end effector relative to the upper electrode, the device forming region on the wafer relative to the wafer edge, the bevel region on the wafer relative to the device forming region, the device forming region relative to the chuck, the device forming region relative to the upper electrode, the bevel region relative to the chuck, the bevel region relative to the upper electrode, etc.

Although the examples herein show the laser assembly mounted independently of the end effector, it is also possible to mount the laser assembly on the end effector for the purpose of traversing within the processing module. Further, although the laser assembly is shown to translate linearly in the X and Y directions, it is possible to move the laser assembly rotationally and record the angle of rotation along with the position of the laser assembly along a given rotational vector.

Furthermore, although the laser assembly is shown to move by mechanical translation mechanism, it is also possible to steer the beam optically, such as by using a prism. As long as the positions of reflectivity discontinuities can be obtained in some reference coordinate system, any suitable technique for causing the light beam to traverse within the processing module may be employed. Additionally or alternatively, although the reflectivity sensor is shown integrated with the laser emitter in the example herein, it is also possible to mount the sensor at any desired location as long as the sensor is capable of sensing reflectivity data with sufficient fidelity to facilitate the determination of reflectivity discontinuities.

Figure 7:
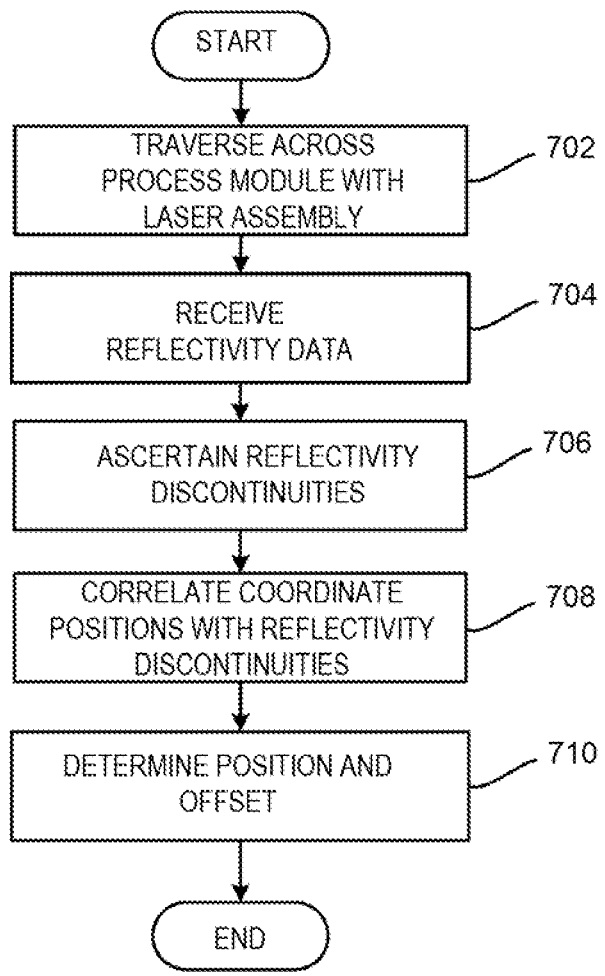
FIG. 7 shows, in accordance with an embodiment of the invention, an illustrative flowchart of the steps of the in-situ optical technique for determining positions and/or offsets of components and/or objects in a processing module.

FIG. 7 shows, in accordance with an embodiment of the invention, a simplified flowchart of the steps of the in-situ optical technique for determining positions and/or offsets of components and/or objects in a processing module. In step 702, the laser assembly traverses inside the processing module to scan the components and/or objects of interest (such as the chuck, the upper electrode, the end effector, the wafer, the regions on the wafer, etc.). In step 704, the reflectivity data from the laser is received by the sensor as the scanning occurs. In step 706, the reflectivity data is analyzed for discontinuities. These discontinuities are correlated with positional information of the laser emitter at the time the reflectivity discontinuities are detected (step 708). These discontinuity-correlated positions are then employed to determine the positions of the various components and/or objects in the processing module. Alternatively or additionally, these discontinuity-correlated positions may be employed to determine the relative positions (i.e., offsets) among the various components and/dr objects in the processing module.

As can be appreciated from the foregoing, embodiments of the invention facilitate in-situ determination of positions and/or offsets of components and objects in a processing module. With in-situ determination, the positions and/or offsets may be ascertained quite rapidly, rendering it possible to employ the positions and/or offsets as feedback to control the robot arm to compensate and/or correct. Furthermore, the use of an optical technique obviates damage and contamination issues associated with the prior art's use of a hardware fixture for calibration. Additionally, since it is no longer necessary to evacuate the wafer from the processing module to perform the measurements, less time is wasted. Still further, the determination of positions and offsets may be performed under the same processing module conditions as the conditions that exist during production, thereby reducing the error of and improving usability of the determination results in actual production environments.

Although various examples are provided herein, it is intended that these examples be illustrative and not limiting with respect to the invention. Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for determining positions and offsets in a plasma processing system, said plasma processing system including a chuck and an upper electrode, said method comprising:

moving a traversing assembly including a light source providing a light beam along a first plurality of paths to cause said light beam to traverse said chuck and to generate one or more data sets of a first plurality of data sets;

analyzing said one or more data sets of said first plurality of data sets to identify a first set of at least three discontinuities that are related to three or more reflected light signals generated when said light beam encounters an edge of said chuck;

determining a center of said chuck using coordinate data associated with said first set of at least three discontinuities;

determining a first set of three or more coordinate data points based on said first set of at least three discontinuities;

determining said center of said chuck and an absolute position of said chuck based on said first set of three or more coordinate data points;

moving said traversing assembly along a second plurality of paths to cause at least one of said light beam and a second light beam to traverse said upper electrode and resulting in one or more data sets of a second plurality of data sets;

analyzing said one or more data sets of said second plurality of data sets to identify a second set of at least three discontinuities representing three or more points on said edge of said upper electrode;

determining a center of said upper electrode using coordinate data associated with said second set of at least three discontinuities;

positioning an optical calibration fixture in a pre-defined location, wherein said first plurality of paths traverse said pre-defined location, and wherein said optical calibration fixture has a plurality of calibration regions; and moving said traversing assembly along each path of said first plurality of paths causing said light beam to traverse said optical calibration fixture and resulting in one or more data sets of a third plurality of data sets, wherein said third plurality of data sets represent a measured reflectivity change of each calibration region of said plurality of calibration regions.

2. The method of claim 1 further comprising employing said absolute position of said chuck and an expected position of said chuck to ascertain an offset between said absolute position of said chuck and said expected position of said chuck.

3. The method of claim 1 further comprising employing said absolute position of said chuck and an absolute position of an upper electrode to calculate a relative offset between said upper electrode and said chuck.

4. The method of claim 1 further comprising:

determining a second set of three or more coordinate data points based on said second set of at least three discontinuities; and determining said center of said upper electrode and an absolute position of said upper electrode based on said three or more second coordinate data points.

5. The method of claim 4 further comprising employing said absolute position of said upper electrode and an expected position of said upper electrode to ascertain an offset between said absolute position of said upper electrode and said expected position of said upper electrode.

6. A method for determining positions and offsets in a plasma processing system, said plasma processing system including a chuck and an upper electrode, said method comprising:

moving a traversing assembly including a light source providing a light beam along a first plurality of paths to traverse said chuck and to generate one or more data sets of a first plurality of data sets;

analyzing said one or more data sets of said first plurality of data sets to identify a first set of at least three discontinuities that are related to three or more reflected light signals generated when said light beam encounters an edge of said chuck;

determining a center of said chuck using coordinate data associated with said first set of at least three discontinuities;

determining a first set of three or more coordinate data points based on said first set of at least three discontinuities;

determining said center of said chuck and an absolute position of said chuck based on said first set of three or more coordinate data points;

positioning an optical calibration fixture in a pre-defined location, wherein said first plurality of paths traverse said pre-defined location, and wherein said optical calibration fixture has a plurality of calibration regions; and moving said traversing assembly along each path of said first plurality of paths causing said light beam to traverse said optical calibration fixture and resulting in one or more data sets of a second plurality of data sets, wherein said second plurality of data sets represent a measured reflectivity change of each calibration region of said plurality of calibrations regions.

7. A plasma processing system for generating plasma to process a substrate, said system comprising:
- a chuck configured to support said substrate in the plasma processing system;
- a traversing assembly including a light source providing a light beam;
- a movement mechanism configured to move said traversing assembly along a first plurality of paths causing said light beam to traverse said chuck and resulting in one or more data sets of a first plurality of data sets;
- a sensor configured to receive light beams reflected from said chuck;
- a processing unit configured to
  - analyze said one or more data sets of said first plurality of data sets to identify a first set of at least three discontinuities that are related to three or more reflected light signals generated when said light beam encounters an edge of said chuck, and
  - determine a center of said chuck using coordinate data associated with said first set of at least three discontinuities,
- wherein said processing unit is also configured to
  - determine a first set of three or more coordinate data points based on said first set of at least three discontinuities, and
  - determine said center of said chuck and an absolute position of said chuck in the plasma processing system based on said first set of three or more coordinate data points;
- an upper electrode configured to generate said plasma,
- wherein said movement mechanism is further configured to move said traversing assembly alone a second plurality of paths causing at least one of said light beam and a second light beam to traverse said upper electrode and resulting in one or more data sets of a second plurality of data sets,
- wherein said sensor is further configured to receive light beams reflected from said upper electrode, and
- wherein said processing unit is further configured to
  - analyze said second plurality of data sets to identify a second set of at least three discontinuities that represent three or more points on said edge of said upper electrode, and
  - determine a center of said upper electrode using coordinate data associated with said second set of at least three discontinuities; and
- an optical calibration fixture positioned in a pre-defined location,
- wherein said first plurality of paths traverse said pre-defined location, wherein said optical calibration fixture has a plurality of calibration regions, wherein said traversing assembly moves along each path of said first plurality of paths causing said light beam to traverse said optical calibration fixture and resulting in one or more data sets of a third plurality of data sets, and wherein said third plurality of data sets represent a measured reflectivity change of each calibration region of said plurality of calibration regions.

8. The system of claim 7 wherein the processing unit is further configured to employ said absolute position of said chuck and an expected position of said chuck to ascertain an offset between said absolute position of said chuck and said expected position of said chuck.

9. The system of claim 7 wherein said processing unit is further configured to employ said absolute position of said chuck and an absolute position of an upper electrode to calculate a relative offset between said upper electrode and said chuck.

10. The system of claim 7 wherein said processing unit is further configured to
- determine a second set of three or more coordinate data points based on said second set of at least three discontinuities, and
- determine said center of said upper electrode and an absolute position of said upper electrode based on said three or more second coordinate data points.

11. The system of claim 10 wherein said processing unit is further configured to employ said absolute position of said upper electrode and an expected position of said upper electrode to ascertain an offset between said absolute position of said upper electrode and said expected position of said upper electrode.

12. A plasma processing system for generating plasma to process a substrate, said system comprising:
- a chuck configured to support said substrate in the plasma processing system;
- a traversing assembly including a light source providing a light beam;
- a movement mechanism configured to move said traversing assembly along a first plurality of paths to cause said light beam to traverse said chuck and to generate one or more data sets of a first plurality of data sets;
- a sensor configured to receive light beams reflected from said chuck;
- a processing unit configured to
  - analyze said first plurality of data sets to identify a first set of at least three discontinuities that are related to three or more reflected light signals generated when said light beam encounters an edge of said chuck, and
  - determine a center of said chuck using coordinate data associated with said first set of at least three discontinuities,
  - determine a first set of three or more coordinate data points based on said first set of at least three discontinuities, and
  - determine said center of said chuck and an absolute position of said chuck in the plasma processing system based on said first set of three or more coordinate data points; and
- an optical calibration fixture positioned in a pre-defined location, wherein said first plurality of paths are configured to traverse said pre-defined location, wherein said optical calibration fixture has a plurality of calibration regions, wherein said traversing assembly moves along each path of said first plurality of paths causing said light beam to traverse said optical calibration fixture and resulting in one or more data sets of a third plurality of data sets, and wherein said third plurality of data sets represent a measured reflectivity change of each calibration region of said plurality of calibration regions.

13. An alignment system, for generating plasma to process a substrate, said system comprising:
- a chuck configured to support said substrate;
- a traversing assembly including a light source providing a light beam;
- a movement mechanism configured to move said traversing assembly along a first plurality of paths causing said light beam to traverse said chuck and resulting in one or more data sets of a first plurality of data sets;
- a sensor configured to receive light beams reflected from the chuck;
- a processing unit configured to
  - analyze said first plurality of data sets to identify a first set of at least three discontinuities that are related to three or more reflected light signals generated when said light beam encounters an edge of said chuck, and
  - determine a center of said chuck using coordinate data associated with said first set of at least three discontinuities;
- an upper electrode configured to generate said plasma,
- wherein said movement mechanism is further configured to move said traversing assembly along a second plurality of paths causing at least one of said light beam and a second light beam to traverse said upper electrode and resulting in one or more data sets of a second plurality of data sets,
- wherein said sensor is also configured to receive light beams reflected from the surface of said upper electrode, and
- wherein said processing unit is also configured to
  - analyze said second plurality of data sets to identify a second set of at least three discontinuities that represent three or more points on said edge of said upper electrode, and
  - determine a center of said upper electrode using coordinate data associated with said second set of at least three discontinuities; and
- an optical calibration fixture positioned in a pre-defined location,
- wherein said first plurality of paths are configured to traverse said pre-defined location, wherein said optical calibration fixture has a plurality of calibration regions, wherein said traversing assembly moves along each path of said first plurality of paths causing said light beam to traverse said optical calibration fixture and resulting in one or more data sets of a third plurality of data sets, and wherein said third plurality of data sets represents a measured reflectivity change of each calibration region of said plurality of calibration regions.

14. The method of claim 1 wherein the plasma processing system includes a plasma processing module in which said chuck is located.

* * * * *

UNITED STATES PATENT AND TRADEMARK OFFICE
CERTIFICATE OF CORRECTION

| | | |
|---|---|---|
| PATENT NO. | : 8,860,955 B2 | Page 1 of 1 |
| APPLICATION NO. | : 12/810790 | |
| DATED | : October 14, 2014 | |
| INVENTOR(S) | : Matt Rodnick et al. | |

It is certified that error appears in the above-identified patent and that said Letters Patent is hereby corrected as shown below:

In the Specification:

Column 11, Line 12          Delete "an/dr" and insert --and/or--

In the Claims:

Column 13, Line 46, Claim 7          Delete "alone" and insert --along--

Signed and Sealed this
Twenty-first Day of April, 2015

Michelle K. Lee
*Director of the United States Patent and Trademark Office*